US012610842B2

(12) United States Patent
Chi et al.

(10) Patent No.: US 12,610,842 B2
(45) Date of Patent: Apr. 21, 2026

(54) ELECTRONIC DEVICE INCLUDING AN UNDERFILL LAYER AND A PROTECTIVE STRUCTURE ADJACENT TO THE UNDERFILL LAYER

(71) Applicant: Innolux Corporation, Miao-Li County (TW)

(72) Inventors: Jen-Hai Chi, Miao-Li County (TW); Chih-Yung Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 908 days.

(21) Appl. No.: 17/845,929

(22) Filed: Jun. 21, 2022

(65) Prior Publication Data

US 2023/0009495 A1     Jan. 12, 2023

Related U.S. Application Data

(60) Provisional application No. 63/219,831, filed on Jul. 9, 2021.

(30) Foreign Application Priority Data

Mar. 16, 2022     (CN) .......................... 202210258940.5

(51) Int. Cl.
H01L 23/00 (2006.01)

(52) U.S. Cl.
CPC .............. H01L 24/32 (2013.01); H01L 24/16 (2013.01); H01L 24/73 (2013.01); H01L 24/83 (2013.01);
(Continued)

(58) Field of Classification Search
CPC ......... H01L 24/16; H01L 24/32; H01L 24/73; H01L 24/83; H01L 2224/26175;
(Continued)

(56) References Cited

U.S. PATENT DOCUMENTS 6,048,656 A * 4/2000 Akram .................... H01L 24/32
257/E21.503
10,629,455 B1 * 4/2020 Chen ................... H01L 23/3114
(Continued)

FOREIGN PATENT DOCUMENTS

CN     103594385     2/2014
TW     200945510     11/2009
(Continued)

OTHER PUBLICATIONS

"Search Report of Europe Counterpart Application", issued on Apr. 24, 2023, p. 1-p. 13.
(Continued)

*Primary Examiner* — Khiem D Nguyen
(74) *Attorney, Agent, or Firm* — JCIPRNET

(57) ABSTRACT

The disclosure provides an electronic device and a manufacturing method thereof. The electronic device includes a substrate, an electronic element, an underfill layer, and a protective structure. The electronic element is disposed on the substrate. At least a portion of the underfill layer is disposed between the substrate and the electronic element. A thickness of the underfill layer is not greater than a height from a surface of the substrate to an upper surface of the electronic element. The protective structure is disposed on the substrate and adjacent to the underfill layer. The electronic device and the manufacturing method thereof of the disclosure may effectively control an area of the underfill layer.

11 Claims, 11 Drawing Sheets

(52) U.S. Cl.
CPC ............... *H01L 2224/16221* (2013.01); *H01L 2224/26175* (2013.01); *H01L 2224/3201* (2013.01); *H01L 2224/32221* (2013.01); *H01L 2224/73204* (2013.01); *H01L 2224/83007* (2013.01); *H01L 2224/83951* (2013.01); *H01L 2924/12041* (2013.01); *H01L 2924/30105* (2013.01); *H01L 2924/30107* (2013.01)

(58) Field of Classification Search
CPC ............. H01L 24/92; H01L 2224/3201; H01L 2224/15311; H01L 2224/16227
See application file for complete search history.

(56) References Cited

U.S. PATENT DOCUMENTS

| | | | |
|---|---|---|---|
| 2008/0067502 A1 | 3/2008 | Chakrapani et al. | |
| 2008/0237892 A1* | 10/2008 | Saeki | H01L 25/0657 |
| | | | 257/778 |
| 2010/0271792 A1* | 10/2010 | Choi | H05K 3/243 |
| | | | 361/767 |
| 2014/0041911 A1* | 2/2014 | Lee | H01L 24/05 |
| | | | 174/250 |
| 2014/0252585 A1* | 9/2014 | Chen | H01L 23/44 |
| | | | 257/692 |

FOREIGN PATENT DOCUMENTS

| | | |
|---|---|---|
| TW | 202017132 | 5/2020 |
| TW | 202018899 | 5/2020 |
| TW | 202021075 | 6/2020 |

OTHER PUBLICATIONS

"Partial Search Report of Europe Counterpart Application", issued on Nov. 29, 2022, p. 1-p. 12.
"Office Action of Taiwan Counterpart Application", issued on Oct. 18, 2022, p. 1-p. 7.

* cited by examiner

122

142b(140b)

130b 145b    145b

142b(140b)

122  120

100b

145c

142c(140c)

122  120

142c(140c)

145c

145c

130b

142c(140c)

142c(140c)

122

145c

100c

ELECTRONIC DEVICE INCLUDING AN UNDERFILL LAYER AND A PROTECTIVE STRUCTURE ADJACENT TO THE UNDERFILL LAYER

CROSS-REFERENCE TO RELATED APPLICATION

This application claims the priority benefit of U.S. provisional application Ser. No. 63/219,831, filed on Jul. 9, 2021, and China application serial no. 202210258940.5, filed on Mar. 16, 2022. The entirety of each of the above-mentioned patent applications is hereby incorporated by reference herein and made a part of this specification.

BACKGROUND

Technical Field

The disclosure relates to an electronic device and a manufacturing method thereof, and more particularly, to an electronic device and a manufacturing method thereof that may effectively control the area of an underfill layer.

Description of Related Art

In general, after an electronic element is bonded to the substrate, an underfill process is performed, so as to allow an underfill layer to enter the gap between the electronic element and the substrate via the siphon phenomenon by means of a jetting process or a dispensing process on the outside of the junction of the electronic element and the substrate, in order to cover the pads and solder balls and fix the relative position between the electronic element and the substrate. However, the underfill layer is free-flowing on the substrate, and therefore it is difficult to control the area thereof, resulting in material waste, and even causing the phenomenon of capacitance/inductance/electromagnetic interference.

SUMMARY

The disclosure is directed to an electronic device and a manufacturing method thereof that may effectively control the area of an underfill layer.

According to an embodiment of the disclosure, an electronic device includes a substrate, an electronic element, an underfill layer, and a protective structure. The electronic element is disposed on the substrate. At least a portion of the underfill layer is disposed between the substrate and the electronic element. A thickness of the underfill layer is not greater than a height from a surface of the substrate to an upper surface of the electronic element. The protective structure is disposed on the substrate and adjacent to the underfill layer.

According to an embodiment of the disclosure, a manufacturing method of an electronic device includes the following steps. A substrate is provided. A confinement region of the substrate is defined. An electronic element is bonded on the substrate. An underfill layer is formed on the substrate.

Based on the above, in an embodiment of the disclosure, the protective structure is disposed on the substrate and adjacent to the underfill layer, thereby limiting the scope of the underfill layer, so that the electronic device of the disclosure may effectively control the area of the underfill layer. Thus, the amount and shape of the underfill layer may be consistent.

In order to make the above features and advantages of the disclosure better understood, embodiments are specifically provided below with reference to figures for detailed description as follows.

DESCRIPTION OF THE EMBODIMENTS

Figure 1:
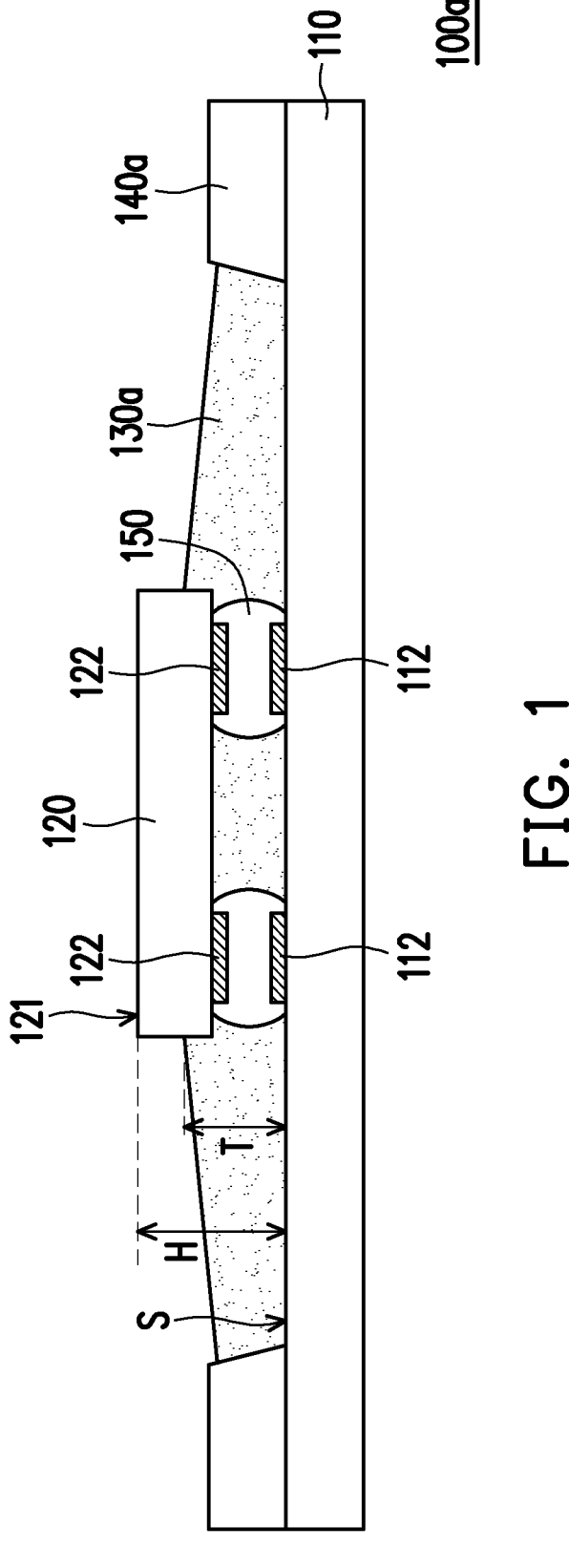
FIG. 1 is a schematic cross-sectional view of an electronic device of an embodiment of the disclosure.

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the number and size of each element in the figures are for illustration, and are not intended to limit the scope of the disclosure.

Certain terms are used throughout the specification and the appended claims of the disclosure to refer to particular elements. Those skilled in the art should understand that electronic equipment manufacturers may refer to the same elements under different names. This article is not intended to distinguish between elements having the same function but different names.

In the following description and claims, the words "including" and "containing" and the like are open words, so they should be interpreted as meaning "including but not limited to . . . ".

Moreover, relative terms, such as "below" or "bottom" and "above" or "top," may be used in the embodiments to describe the relative relationship of one element of the drawings to another element. It will be understood that if the device in the figures were turned upside down, elements described on the "lower" side would become elements described on the "upper" side.

In some embodiments of the disclosure, terms such as "connection", "interconnection", etc., regarding bonding and connection, unless specifically defined, may mean that two structures are in direct contact, or that two structures are not in direct contact (indirect contact) and there are other structures located between these two structures. Moreover, the terms of bonding and connecting may also include the case where both structures are movable or both structures are fixed. Moreover, the term "coupled" includes the transfer of energy between two structures by means of direct or indirect electrical connection, or the transfer of energy by means of mutual induction between two separate structures.

It should be understood that when an element or film layer is referred to as "on" or "connected to" to another element or film layer, the element or film layer may be directly on the other element or film layer or directly connected to the other element or film layer, or there is an inserted element or film layer between the two (indirect case). Conversely, when an element is referred to as "directly" on or "directly connected" to another element or film layer, there is no intervening element or film layer between the two.

The terms "about", "equal to", "equal" or "identical", "substantially" or "roughly" are generally interpreted as being within 20% of a given value or range, or interpreted as being within 10%, 5%, 3%, 2%, 1%, or 0.5% of a given value or range.

As used herein, the terms "film" and/or "layer" may refer to any continuous or discontinuous structure and material (such as a material deposited by a method disclosed herein). For example, the film and/or layer may include a two-dimensional material, a three-dimensional material, a nanoparticle, or even a partial or complete molecular layer, or a partial or complete atomic layer, or a cluster of atoms and/or molecules. The film or layer may include a material or layer having a pinhole, which may be at least partially continuous.

Although the terms first, second, third . . . may be used to describe various constituent elements, the constituent elements are not limited to these terms. These terms are used to distinguish a single constituent element from other constituent elements in the specification. The same terms may not be used in the claims, and the elements in the claims may be replaced with first, second, third . . . according to the order declared by the elements in the claims. Therefore, in the following description, the first constituent element may be the second constituent element in the claims.

Unless otherwise defined, all terms (including technical and scientific terms) used herein have the same meaning as commonly understood by one of ordinary skill in the art to which this disclosure belongs. It should be understood that, these terms, such as those defined in commonly used dictionaries, should be interpreted as having meaning consistent with the relevant technique and the background or context of the disclosure, and should not be interpreted in an idealized or excessively formal way, unless specifically defined.

It should be noted that in the following embodiments, the technical features in several different embodiments may be replaced, recombined, and mixed to complete other embodiments without departing from the spirit of the disclosure.

An electronic device of disclosure may include a display device, antenna device, sensing device, light-emitting device, and/or tiling device, but the disclosure is not limited thereto. The electronic device may include a bendable or flexible electronic device. The electronic device may include an electronic element. The electronic element may include a passive element and an active element, such as a capacitor, resistor, inductor, variable capacitor, filter, diode, transistor, sensor, microelectromechanical system (MEMS), liquid-crystal chip, etc., but the disclosure is not limited thereto. The diode may include a light-emitting diode or a photodiode. The light-emitting diode may include, for example, an organic light-emitting diode (OLED), a mini LED, micro LED, or quantum dot light-emitting diode, fluorescence, phosphor, or other suitable materials, or a combination of the above, but the disclosure is not limited thereto. The sensor may include, for example, a capacitive sensor, optical sensor, electromagnetic sensor, fingerprint sensor (FPS), touch sensor, antenna, or pen sensor, but the disclosure is not limited thereto. The following adopts a display device as an electronic device to explain the content of the disclosure, but the disclosure is not limited thereto.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

FIG. 1 is a schematic cross-sectional view of an electronic device of an embodiment of the disclosure. Referring to FIG. 1, in the present embodiment, an electronic device 100a includes a substrate 110, an electronic element 120, an underfill layer 130a, and a protective structure 140a. The electronic element 120 is disposed on the substrate 110. At least a portion of the underfill layer 130a is disposed between the substrate 110 and the electronic element 120. A thickness T of the underfill layer 130a is not greater than a height H from a surface S of the substrate 110 to an upper surface 121 of the electronic element 120. The protective structure 140a is disposed on the substrate 110 and adjacent to the underfill layer 130a.

Specifically, in the present embodiment, the substrate 110 is, for example, a glass substrate, a glass fiber (FR4) substrate, a flexible plastic substrate, a thin-film substrate, a flexible substrate, or other suitable substrates, but the disclosure is not limited thereto. A thin-film transistor or other driving circuits may be disposed on the substrate. The substrate 110 includes a plurality of first pads 112 separated from each other, wherein the first pads 112 may be disposed on the surface S of the substrate 110, but the disclosure is not limited thereto. In another embodiment, the surface of the substrate has a concave portion, and the first pads 112 may also be disposed in the concave portion, which still belongs to the scope of the disclosure.

The electronic element 120 is, for example, an LED chip that may be a chip made of silicon (Si), gallium arsenide (GaAs), gallium nitride (GaN), silicon carbide (SiC), sapphire, or a glass substrate, but the disclosure is not limited thereto. In another embodiment, the electronic element 120 may also be a semiconductor package element, such as a ball grid array (BGA) package element, a chip size package (CSP) element, a flip-chip or 2.5 D/3D semiconductor package element, but the disclosure is not limited thereto. In another embodiment, the electronic element 120 may also be any kind of chip, such as an integrated circuit (IC), transistor, silicon-controlled rectifier, valve, thin-film transistor, capacitor, inductor, variable capacitor, filter, resistor, diode, MEMS, liquid-crystal chip, etc., but the disclosure is not limited thereto. The electronic element 120 includes a plurality of second pads 122 separated from each other, wherein the first pads 112 and the second pads 122 are structurally and electrically connected together via a plurality of solder balls 150. That is, the electronic element 120 of the present embodiment is, for example, flip-chip bonded on the substrate 110.

As shown in FIG. 1, the underfill layer 130a is disposed between the substrate 110 and the electronic element 120 and covers the first pads 112, the second pads 122, and the solder balls 150. The underfill layer 130a may be configured to increase the adhesion between the electronic element 120 and the substrate 110, and may fix the relative positions of the first pads 112, the solder balls 150, and the second pads 122. In an embodiment, in the case where the electronic device 100a is, for example, an antenna device or a sensing device, when the thickness T of the underfill layer 130a is not greater than the height H from the surface S of the substrate 110 to the upper surface 121 of the electronic element 120, a high-frequency signal may be allowed to pass through and the loss of the high-frequency signal may be reduced. In another embodiment not shown, to further reduce the amount of signal loss, the thickness of the underfill layer below the electronic element may be less than the height from the surface of the substrate to the lower surface of the electronic element. In another embodiment not shown, the underfill layer may also completely cover the electronic element, and in the case of an electronic element such as an LED, the electronic device may have better light pattern and light focusing effect.

Moreover, the disposition of the protective structure 140*a* of the present embodiment may define a confinement region A on the substrate 110, wherein the protective structure 140*a* is, for example, a closed structure, such as a continuous mountain-shaped dam or a continuous wall that may surround the underfill layer 130*a* to limit the region of the underfill layer 130*a*. In other words, the underfill layer 130*a* is confined to be located in the confinement region A. In an embodiment, the material of the protective structure 140*a* may be, for example, an organic material, but the disclosure is not limited thereto. The top view shape of the protective structure 140*a* may be, for example, a hollow rectangle, and the thickness of the protective structure 140*a* may be, for example, 1 micrometer (μm) to 100 μm, but the disclosure is not limited thereto.

In manufacture, please refer to FIG. 1 again. First, the substrate 110 is provided, wherein the substrate 110 includes the first pads 112. The material of the first pads 112 may be electroless nickel immersion gold (abbreviated as ENIG) or other conductive materials. Next, the protective structure 140*a* is formed on the substrate 110 to define the confinement region A of the substrate 110. Next, the electronic element 120 is bonded on the substrate 110, wherein the electronic element 120 includes the second pads 122, and the material of the second pads 122 may be ENIG or other conductive materials. The first pads 112 and the second pads 122 are structurally and electrically connected together via the plurality of solder balls 150. It should be noted that the disclosure does not limit the sequence of forming the protective structure 140*a* on the substrate 110 and bonding the electronic element 120 on the substrate 110. In other words, the protective structure 140*a* may be formed on the substrate 110 first, and then the electronic element 120 is bonded on the substrate 110; alternatively, the electronic element 120 is bonded on the substrate 110 first, and then the protective structure 140*a* is formed on the substrate 110. Lastly, the underfill layer 130*a* is formed on the substrate 110, wherein the underfill layer 130*a* is disposed between the substrate 110 and the electronic element 120 and covers the first pads 112, the second pads 122, and the solder balls 150. At this point, the manufacture of an electronic device 100*a* is completed.

In short, the protective structure 140*a* of the present embodiment may limit the area of the underfill layer 130*a*, so that the amount and shape of the underfill layer 130*a* are consistent. Considering the electronic device 100*a* applied to high-frequency transmission, the material loss of the high-frequency signal in the electronic device 100*a* needs to be consistent. In other words, in the present embodiment, the protective structure 140*a* is provided to adjust/limit the amount of the underfill layer 130*a*, so that the electronic device 100*a* of the present embodiment may effectively control the area of the underfill layer 130*a*.

It must be noted here that the following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

Figure 2A:
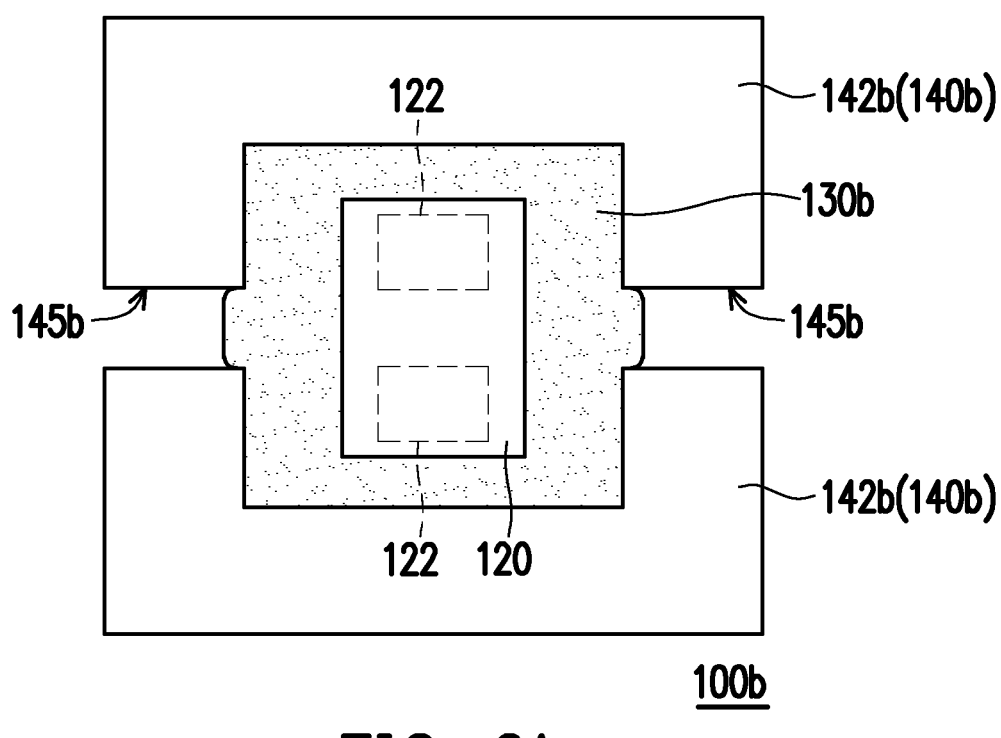
FIG. 2A is a schematic top view of an electronic device of an embodiment of the disclosure.

FIG. 2A is a schematic top view of an electronic device of an embodiment of the disclosure. Please refer to FIG. 1 and FIG. 2A at the same time, an electronic device 100*b* is similar to the electronic device 100*a* of FIG. 1, and the difference between the two is: in the present embodiment, in consideration of uniformity, a protective structure 140*b* may be a non-closed structure. Specifically, the protective structure 140*b* of the present embodiment has a plurality of openings 145*b* (two openings 145*b* are schematically shown), and includes a plurality of retaining wall patterns 142*b* separated from each other (two retaining wall patterns 142*b* are schematically shown). The size of the retaining wall patterns 142*b* may be the same, and the retaining wall patterns 142*b* may be in a mirror structure, but the disclosure is not limited thereto. The openings 145*b* are located between the retaining wall patterns 142*b*, wherein the shape of the openings 145*b* is, for example, a rectangle, and a portion of the underfill layer 130*b* is extended into the openings 145*b*. In addition to accommodating the overflowing adhesive, the design of the openings 145*b* also has the function of exhausting the air existing in the underfill layer 130*b*.

Figure 2B:
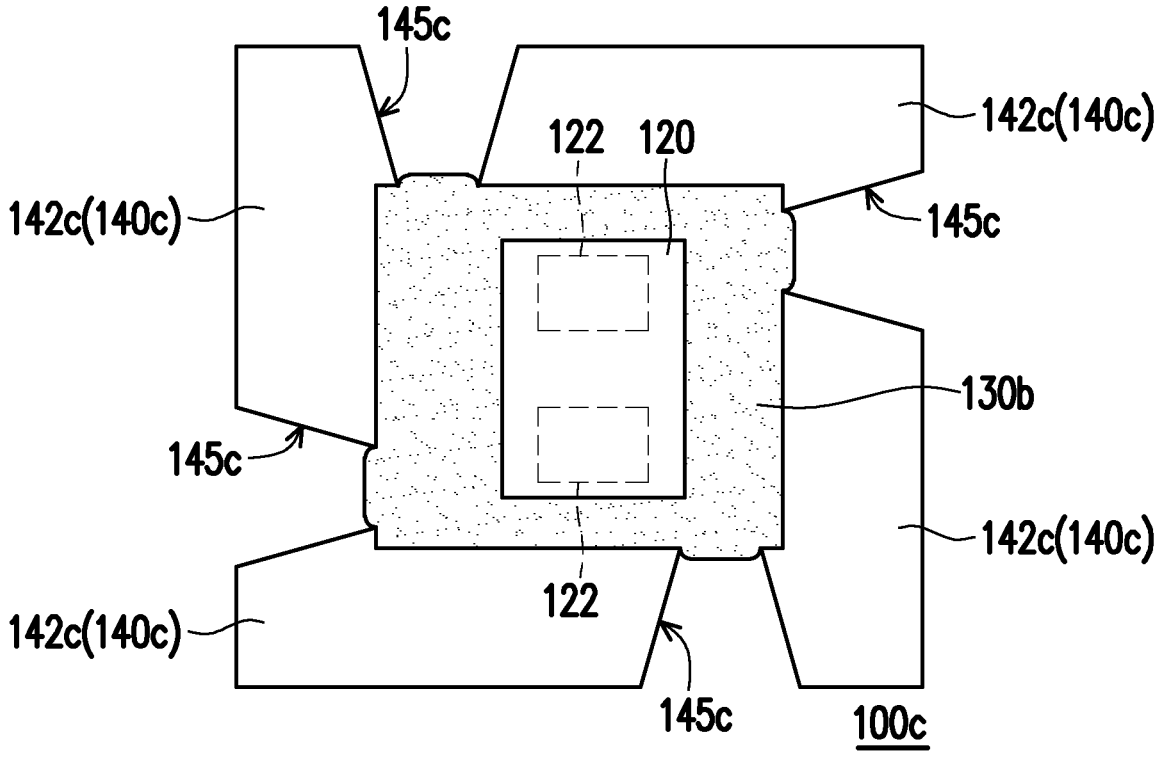
FIG. 2B is a schematic top view of an electronic device of another embodiment of the disclosure.

FIG. 2B is a schematic top view of an electronic device of another embodiment of the disclosure. Please refer to FIG. 2A and FIG. 2B at the same time, an electronic device 100*c* is similar to the electronic device 100*b* of FIG. 2A, and the differences between the two are: in the present embodiment, a protective structure 140*c* has four openings 145*c* and includes four retaining wall patterns 142*c* separated from each other. The size of the retaining wall patterns 142*c* may be the same, wherein the four retaining wall patterns 142*c* are arranged to be, for example, a swastika but the disclosure is not limited thereto. The openings 145*c* are located between the retaining wall patterns 142*c*, wherein the diameter of the openings 145*c* is gradually increased from adjacent to the underfill layer 130*b* to the direction away from the underfill layer 130*b* to form, for example, a trapezoid shape, and a portion of the underfill layer 130*b* is extended into the openings 145*c*. In addition to accommodating the overflowing adhesive, the design of the openings 145*c* also has the function of exhausting the air existing in the underfill layer 130*b*.

In another embodiment not shown, considering wetting conditions, the plurality of retaining wall patterns of the protective structure may also have different sizes. Alternatively, the shapes of these retaining wall patterns may also be different and asymmetrical, which still falls within the scope of the disclosure.

Figure 3:
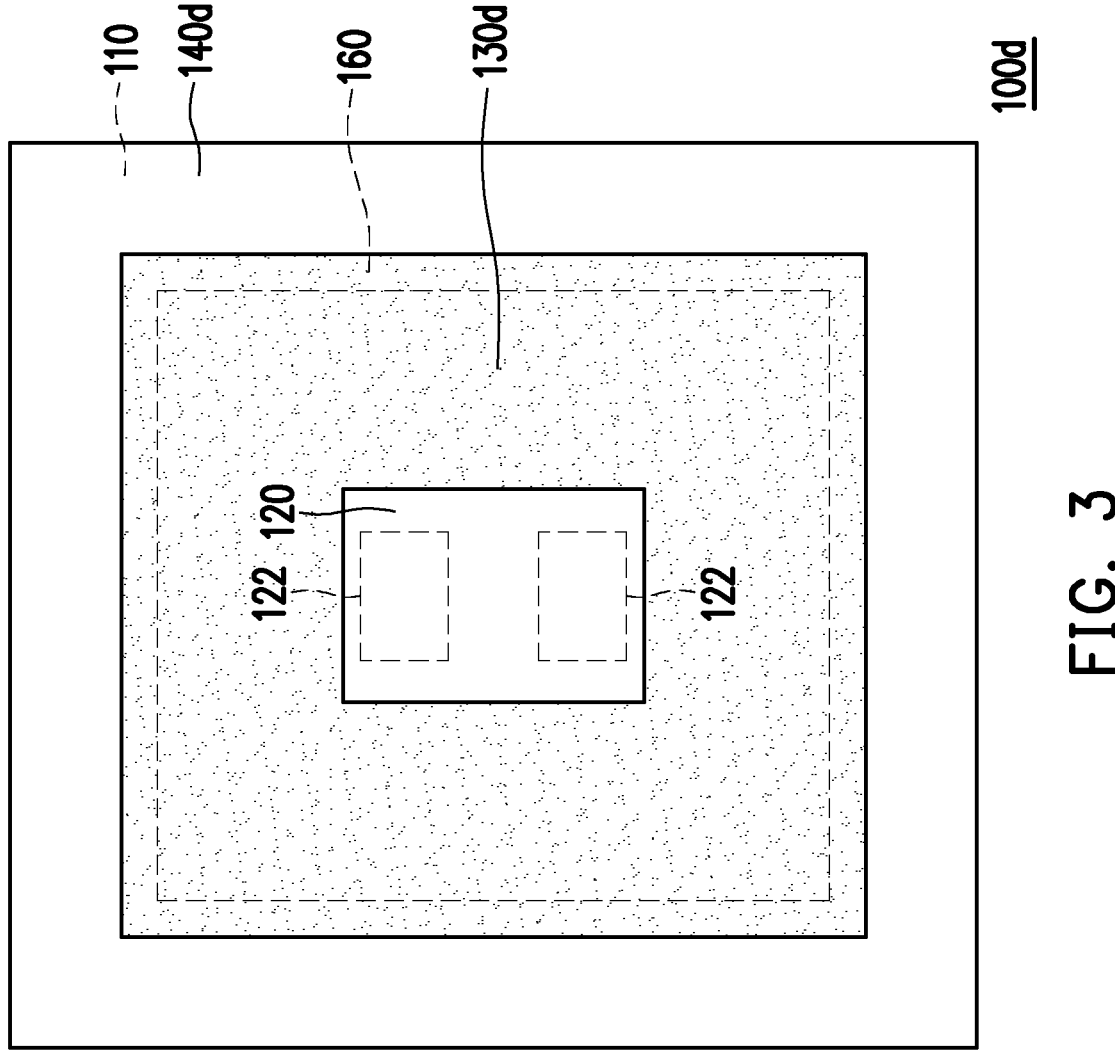
FIG. 3 is a schematic top view of an electronic device of another embodiment of the disclosure.

FIG. 3 is a schematic top view of an electronic device of another embodiment of the disclosure. Please refer to FIG. 1 and FIG. 3 at the same time, an electronic device 100*d* is similar to the electronic device 100*a* of FIG. 1, and the difference between the two is: in the present embodiment, when the thickness of a protective structure 140*d* is insufficient, the electronic device 100*d* further includes a metal layer 160 disposed on the substrate 110 and located between the protective structure 140*d* and the substrate 110, in order to avoid overflow of the underfill layer 130*d*. In an embodiment, the orthographic projection of the protective structure 140$d$ on the substrate 110 is completely overlapped with the orthographic projection of the metal layer 160 on the substrate 110, wherein the orthographic projection of the metal layer 160 on the substrate 110 is less than the orthographic projection of the protective structure 140$d$ on the substrate 110, but the disclosure is not limited thereto.

Figure 4A:
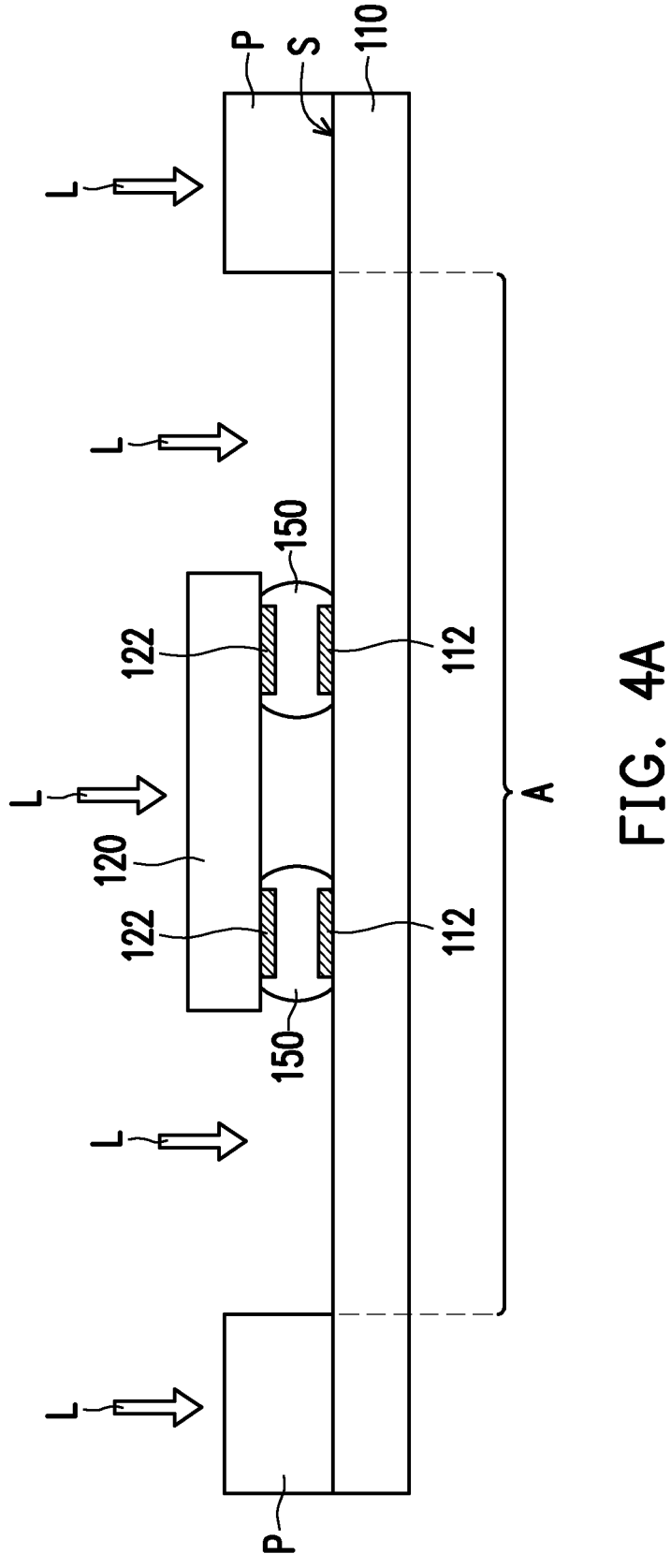
FIG. 4A to FIG. 4C are schematic cross-sectional views of a manufacturing method of an electronic device of an embodiment of the disclosure.
Figure 4B:
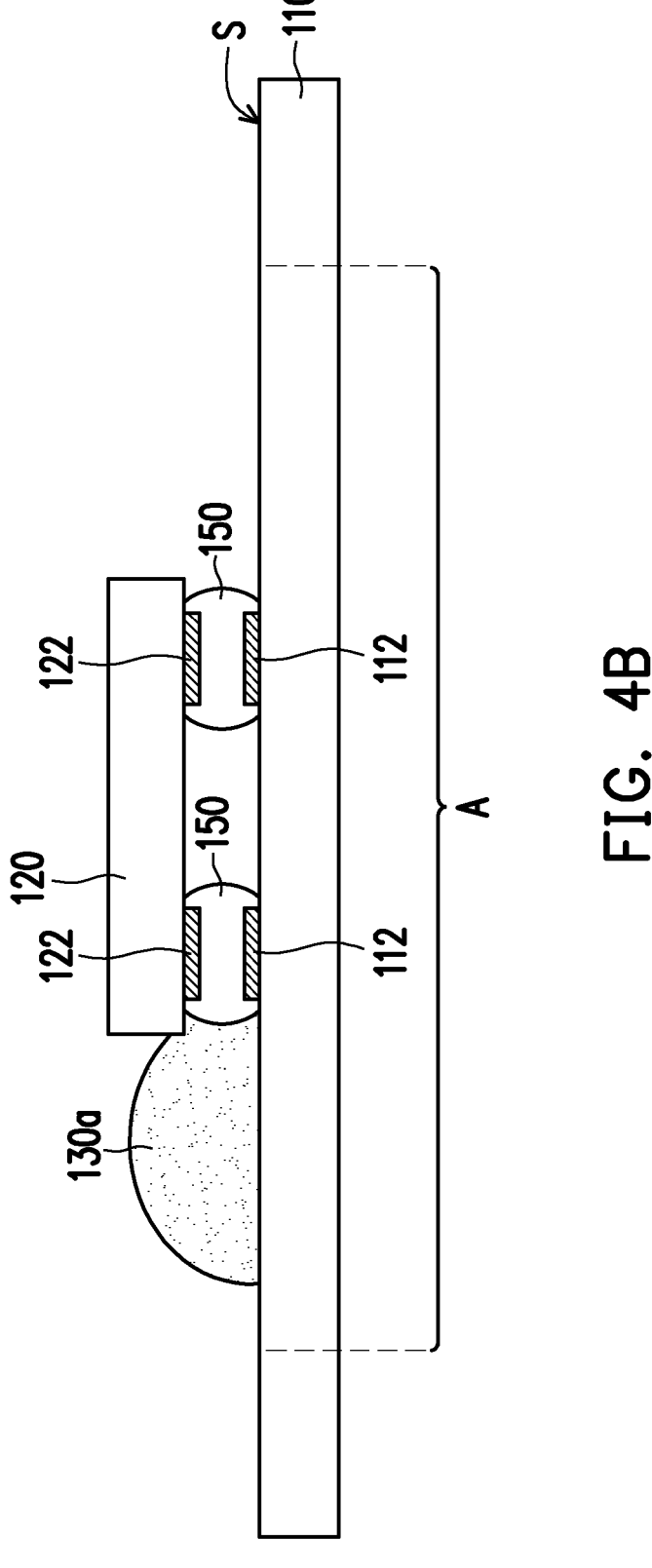
Figure 4C:
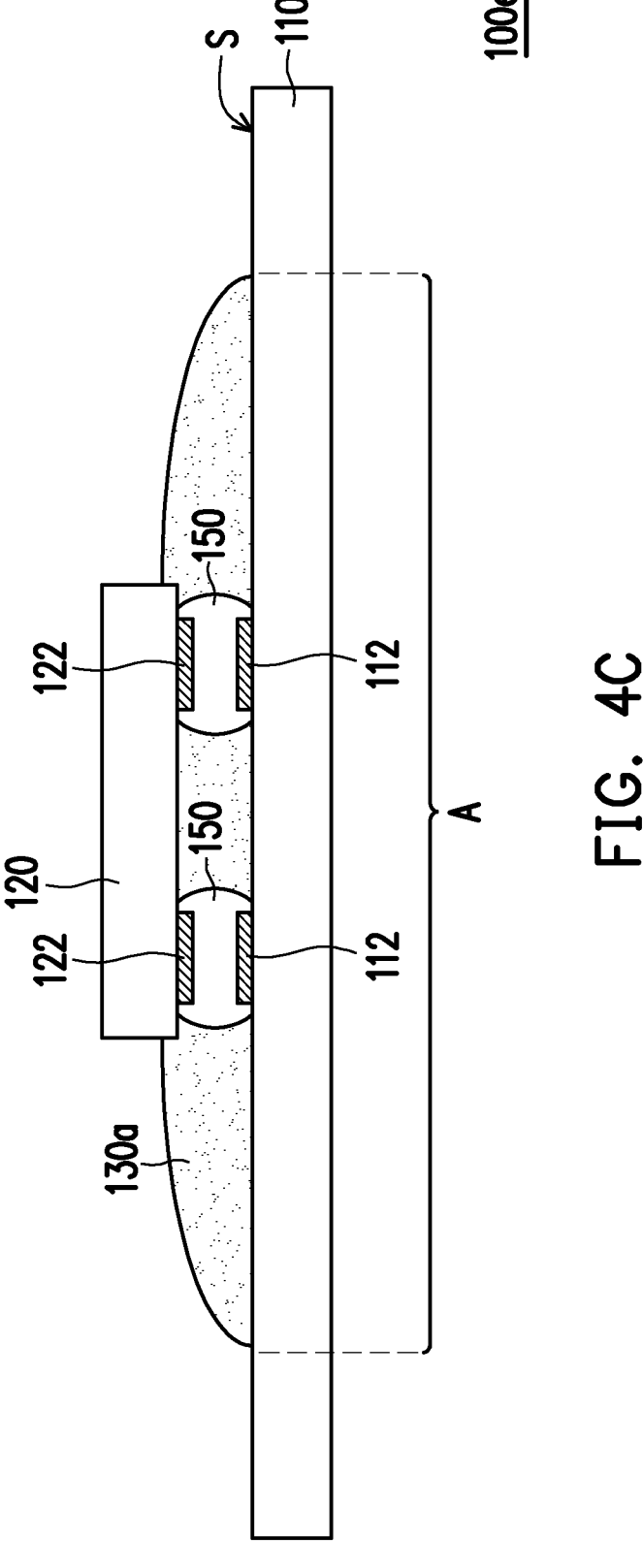

FIG. 4A to FIG. 4C are schematic cross-sectional views of a manufacturing method of an electronic device of an embodiment of the disclosure. First, referring to FIG. 4A, the substrate 110 is provided, wherein the substrate 110 includes the first pads 112 thereon. Next, the electronic element 120 is bonded on the substrate 110, wherein the electronic element 120 includes the second pads 122, and the first pads 112 and the second pads 122 are structurally and electrically connected together via the solder balls 150. Next, a steel plate P is disposed on a portion of the surface S of the substrate 110, wherein the steel plate P surrounds the periphery of the electronic element 120. Next, the electronic element 120 and the substrate 110 exposed to the outside of the steel plate P are irradiated with an energy beam L. Here, the energy beam L is, for example, extreme ultraviolet (EUV) or plasma that may effectively reduce the contact angle of the substrate 110, in order to increase the wettability of the subsequent underfill layer 130$a$ (please refer to FIG. 4C). Next, referring to FIG. 4B, the steel plate P is removed to define the confinement region A on the substrate 110. In other words, the step of defining the confinement region A of the substrate 110 in the present embodiment is to treat the surface S of the substrate 110 via the energy beam L, so as to perform surface modification on a partial area of the substrate 110 (i.e., the confinement region A). Lastly, referring to FIG. 4B and FIG. 4C at the same time, the underfill layer 130$a$ is formed on the substrate 110, wherein the underfill layer 130$a$ may readily flow to the confinement region A via the siphon phenomenon in order to cover the first pads 112, the second pads 122, and the solder balls 150, and the underfill layer 130$a$ does not flow to a region without surface modification (i.e., the region other than the confinement region A). At this point, the manufacture of an electronic device 100$e$ is completed.

Figure 5A:
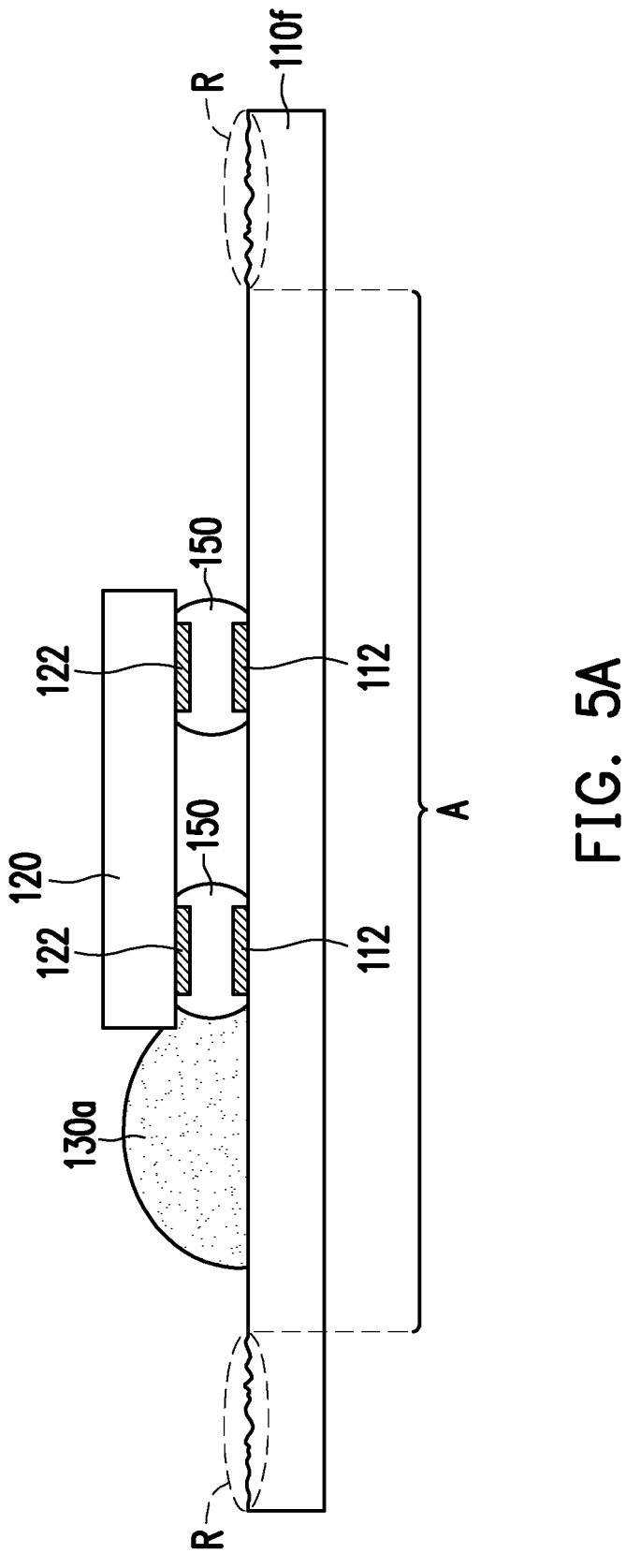
FIG. 5A to FIG. 5B are schematic cross-sectional views of some of the steps of a manufacturing method of an electronic device of another embodiment of the disclosure.
Figure 5B:
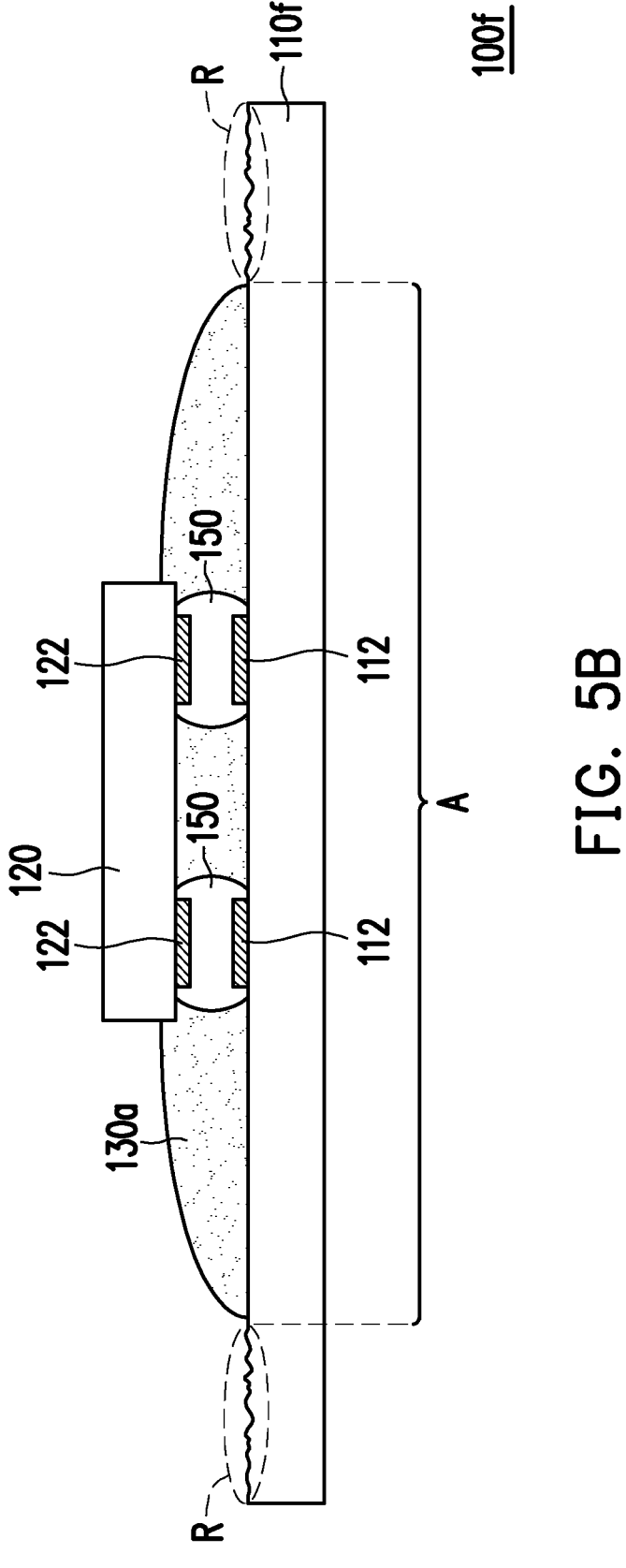

FIG. 5A to FIG. 5B are schematic cross-sectional views of some of the steps of a manufacturing method of an electronic device of another embodiment of the disclosure. First, referring to FIG. 5A, a substrate 110$f$ is provided, wherein the substrate 110$f$ includes the first pads 112 thereon. Next, a portion of the substrate 110$f$ is covered with photoresist. Next, surface treatment is performed on the substrate 110$f$ by means of plasma, sandblasting, or etching, so as to form a surface roughness structure R in the region of the substrate 110$f$ not covered with photoresist, so as to define the confinement region A of the substrate 110$f$. Next, the photoresist is removed, and the electronic element 120 is bonded on the substrate 110, wherein the electronic element 120 includes the second pads 122, and the first pads 112 and the second pads 122 are structurally and electrically connected together via the solder balls 150. Lastly, referring to FIG. 5A and FIG. 5B at the same time, the underfill layer 130$a$ is formed on the substrate 110$f$, wherein the underfill layer 130$a$ may readily flow to the confinement region A via the siphon phenomenon in order to cover the first pads 112, the second pads 122, and the solder balls 150 and be cured, and the underfill layer 130$a$ does not flow on the surface roughness structure R. At this point, the manufacture of an electronic device 100$f$ is completed.

Since the underfill layer 130$a$ is not wetted when the roughness is higher, the flow range of the underfill layer 130$a$ may be limited by roughening the surface of a region where the underfill layer 130$a$ is not needed, so as to control the area of the underfill layer 130$a$.

In another embodiment not shown, the surface roughness structure R may also be replaced by a plurality of microstructures separated from each other. In detail, first, a substrate is provided. Next, a portion of the substrate is covered with photoresist, and microstructures are manufactured via steps such as lithography, so as to define a confinement region of the substrate. Next, an electronic element is bonded on the substrate. Lastly, an underfill layer is formed on the substrate, wherein the underfill layer may readily flow to the confinement region via the siphon phenomenon to be cured, and the underfill layer does not flow on the microstructures. At this point, the manufacture of the electronic device is completed.

Figure 6A:
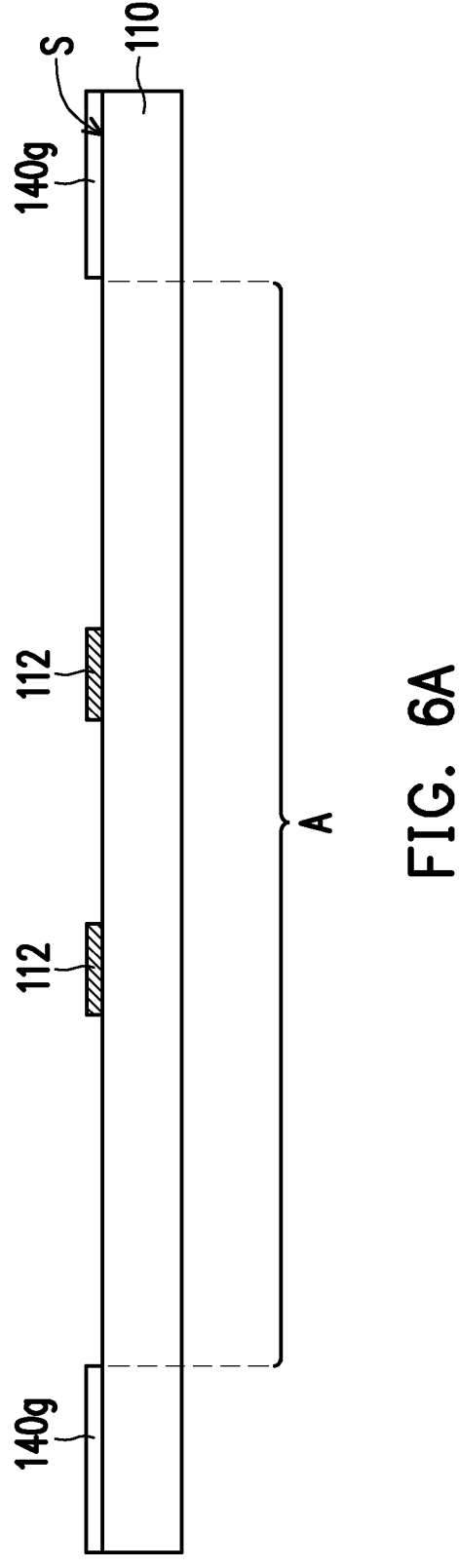
FIG. 6A to FIG. 6C are schematic cross-sectional views of a manufacturing method of an electronic device of another embodiment of the disclosure.
Figure 6B:
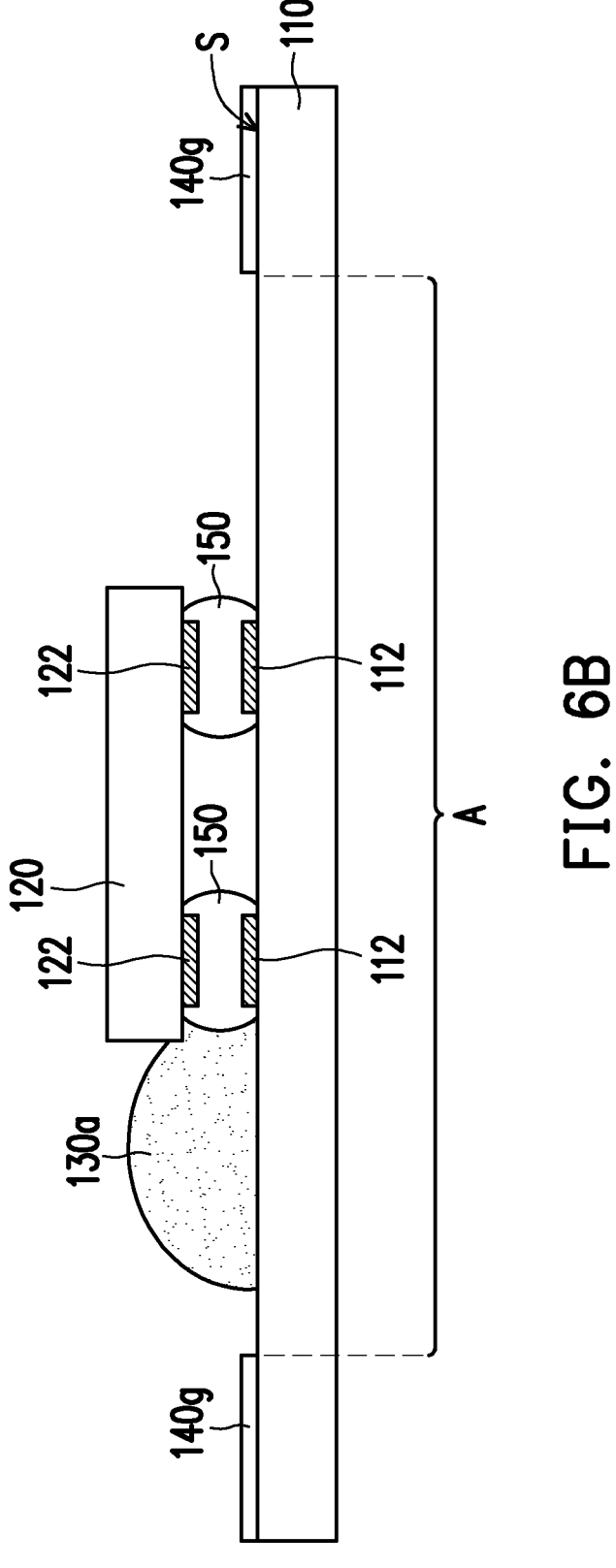
Figure 6C:
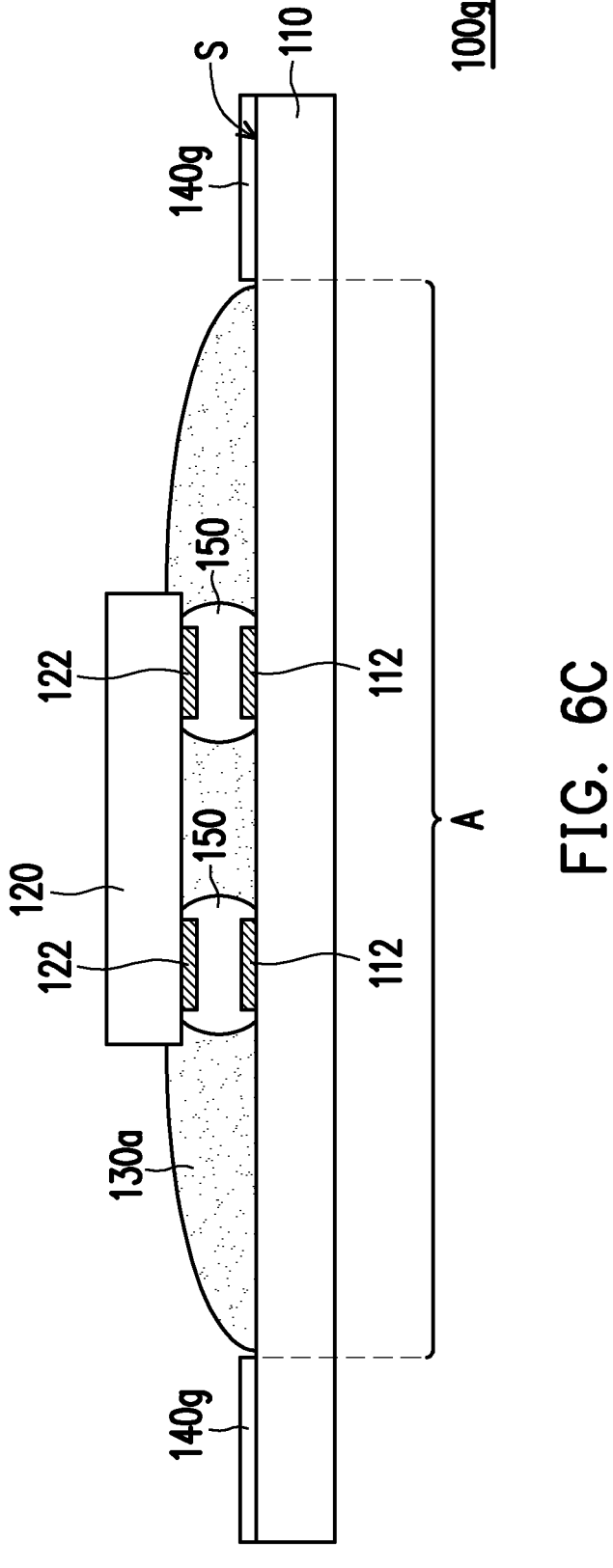

FIG. 6A to FIG. 6C are schematic cross-sectional views of a manufacturing method of an electronic device of another embodiment of the disclosure. First, referring to FIG. 6A, the substrate 110 is provided, wherein the substrate 110 includes the first pads 112 thereon. Next, a fluorine-containing substance is coated on the substrate 110 via screen printing. Next, the fluorine-containing substance is dried to dehydrate the surface S of the substrate 110 and the fluorine-containing substance to generate a Si—O bond to form a hydrophobic protective structure 140$g$, and the protective structure 140$g$ defines the confinement region A of the substrate 110. Next, referring to FIG. 6B, the electronic element 120 is bonded on the substrate 110, wherein the electronic element 120 includes the second pads 122, and the first pads 112 and the second pads 122 are structurally and electrically connected together via the solder balls 150. Lastly, referring to FIG. 6B and FIG. 6C at the same time, the underfill layer 130$a$ is formed on the substrate 110, wherein the underfill layer 130$a$ may readily flow to the confinement region A via the siphon phenomenon in order to cover the first pads 112, the second pads 122, and the solder balls 150 and be cured, and the underfill layer 130$a$ does not flow on the protective structure 140$g$. At this point, the manufacture of an electronic device 100$g$ is completed.

Since the surface S of the substrate 110 is coated with the fluorine-containing substance, the protective structure 140$g$ having hydrophobicity is formed, so that the underfill layer 130$a$ is not wetted by the protective structure 140$g$. Thereby, the flow range of the underfill layer 130$a$ is limited, so as to control the area of the underfill layer 130$a$.

In another embodiment not shown, the fluorine-containing substance may also be replaced by a polymer, such as a fluorocarbon polymer. In detail, first, a substrate is provided. Next, using chlorofluorocarbon ($C_4F_8$) as the reactive gas, a fluorocarbon polymer thin film is formed on the substrate by inductively coupled plasma chemical vapor deposition (ICP-CVD) at room temperature, wherein the fluorocarbon polymer thin film covers the entire surface of the substrate. Next, the fluorocarbon polymer thin film is patterned by lithography to form a hydrophobic protective structure and define a confinement region of the substrate. That is, in addition to fluorocarbon chains reducing surface energy, silanes may also be used to form a hydrophobic surface. Next, an electronic element is bonded on the substrate. Lastly, an underfill layer is formed on the substrate, wherein the underfill layer may readily flow in the confinement region via the siphon phenomenon to be cured, and the underfill layer does not flow on the protective structure. At this point, the manufacture of the electronic device is completed.

Based on the above, in an embodiment of the disclosure, the protective structure is disposed on the substrate and adjacent to the underfill layer, thereby limiting the scope of the underfill layer, so that the electronic device of the disclosure may effectively control the area of the underfill layer. Thus, the amount and shape of the underfill layer may be consistent.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising:
a substrate;
an electronic element disposed on the substrate;
an underfill layer, wherein at least a portion of the underfill layer is disposed between the substrate and the electronic element, and a thickness of the underfill layer is not greater than a height from a surface of the substrate to an upper surface of the electronic element; and
a protective structure disposed on the substrate and adjacent to the underfill layer,
wherein the protective structure comprises a plurality of retaining wall patterns, the protective structure has a plurality of trapezoid shape openings, the plurality of trapezoid shape openings are located between the plurality of retaining wall patterns, and a portion of the underfill layer is extended into the plurality of trapezoid shape openings, and a diameter of the plurality of trapezoid shape openings is gradually increased from adjacent to the underfill layer to a direction away from the underfill layer.

2. The electronic device of claim 1, wherein the protective structure surrounds the underfill layer.

3. The electronic device of claim 2, wherein a shape of the protective structure comprises a continuous gabled dam or a continuous retaining wall.

4. The electronic device of claim 1, wherein the protective structure comprises a fluorine-containing substance.

5. The electronic device of claim 1, wherein the protective structure comprises a polymer.

6. The electronic device of claim 5, wherein the protective structure comprises a fluorocarbon polymer.

7. The electronic device of claim 1, further comprising:
a metal layer disposed on the substrate and located between the protective structure and the substrate.

8. The electronic device of claim 7, wherein an orthographic projection of the protective structure on the substrate is completely overlapped with an orthographic projection of the metal layer on the substrate.

9. The electronic device of claim 7, wherein an orthographic projection of the metal layer on the substrate is less than an orthographic projection of the protective structure on the substrate.

10. The electronic device of claim 1, wherein the substrate comprises a plurality of first pads, the electronic element comprises a plurality of second pads, and the plurality of first pads and the plurality of second pads are electrically connected together via a plurality of solder balls.

11. The electronic device of claim 1, wherein a thickness of the protective structure is between 1 μm and 100 μm.

\* \* \* \* \*